United States Patent
Yan et al.

(10) Patent No.: US 6,806,492 B2
(45) Date of Patent: Oct. 19, 2004

(54) HETEROJUNCTION ORGANIC SEMICONDUCTOR FIELD EFFECT TRANSISTOR (FET) WITH A GATE INSULATION LAYER AND MANUFACTURING PROCESS THEREOF

(75) Inventors: Donghang Yan, Changchun (CN); Jian Zhang, Changchun (CN); Jun Wang, Changchun (CN); Haibo Wang, Changchun (CN); Xuanjun Yan, Changchun (CN)

(73) Assignee: Changchun Institute of Applied Chemistry Chinese Academy of Science, Changchun (CN)

( * ) Notice: Subject to any disclaimer, the term of this patent is extended or adjusted under 35 U.S.C. 154(b) by 0 days.

(21) Appl. No.: 10/614,987

(22) Filed: Jul. 9, 2003

(65) Prior Publication Data

US 2004/0150050 A1 Aug. 5, 2004

(30) Foreign Application Priority Data

Jan. 30, 2003 (CN) .......................................... 03102064 A

(51) Int. Cl.$^7$ .......................... H01L 35/24; H01L 51/40
(52) U.S. Cl. ........................ 257/40; 257/192; 257/347; 438/99; 438/151

(58) Field of Search ............................ 257/40, 192, 77, 257/347, 613, 289, 66; 438/99, 151, 158, 161

(56) References Cited

U.S. PATENT DOCUMENTS

| | | | | |
|---|---|---|---|---|
| 5,107,308 A | * | 4/1992 | Koezuka et al. | 257/40 |
| 5,355,235 A | * | 10/1994 | Nishizawa et al. | 349/43 |
| 5,500,537 A | * | 3/1996 | Tsumura et al. | 257/40 |
| 5,596,208 A | * | 1/1997 | Dodabalapur et al. | 257/66 |
| 6,621,098 B1 | * | 9/2003 | Jackson et al. | 257/40 |
| 6,635,508 B2 | * | 10/2003 | Arai et al. | 438/99 |
| 2002/0164835 A1 | * | 11/2002 | Dimitrakopoulos et al. | 438/99 |

* cited by examiner

*Primary Examiner*—Mark V. Prenty
(74) *Attorney, Agent, or Firm*—Fei-Fei Chao; Venable LLP

(57) ABSTRACT

A organic semiconductor field effect transistor that can work in the depletion mode or super-inverse mode, comprising: a substrate (1), a gate electrode (2) formed on the substrate (1), a gate insulation layer (3) formed on the substrate (1) and the gate electrode (2), a first semiconductor layer (4) formed on the gate insulation layer (3), a source electrode and a drain electrode (5) formed on the first semiconductor layer (4), and a second semiconductor layer (6) formed on the first semiconductor layer (4) and the source/drain electrodes (5).

9 Claims, 5 Drawing Sheets

HETEROJUNCTION ORGANIC SEMICONDUCTOR FIELD EFFECT TRANSISTOR (FET) WITH A GATE INSULATION LAYER AND MANUFACTURING PROCESS THEREOF

BACKGROUND OF THE INVENTION

1. Field of the Invention

The present invention relates to a heterojunction organic semiconductor Field Effect Transistor (to be abbreviated as HJOSFET hereinafter, and the Field Effect Transistor is abbreviated as FET hereinafter) and manufacturing process thereof and, more particularly, to a HJOSFET with a gate insulation layer and manufacturing process thereof.

2. Description of the Related Art

In recent years, the research on organic semiconductor is exceptionally active. The performance of the organic FET is superior to that of the amorphous silicon thin film transistor (a-Si:H TFT). In particular, the mobility of some organic micro-molecule oligomers (e.g. Pentacene, Tetracene, etc.) is over 1 (square centimeter per volt per second) at room temperature. So, the organic FET is potential in such practical applications as flexural integrated circuit (to be abbreviated as IC hereinafter), active matrix display and so on. Generally, the conventional organic semiconductor material is of high resistance characteristic, and the conventional FET made of organic semiconductor works in the mode of accumulation type. In this mode, when the gate voltage is low, the output current of the FET is low, as is called off-state; when the gate voltage is high, the output current of the FET is high, as is called on-state. So this kind of device is suitable for often working in the mode of off-state. However, a kind of depletion mode device often working in on-state is also needed in practical applications to realize low power waste, steady performance and simple structure in the logic circuit. The China Invention Patent Application No. 02129458.5 disclosed a sandwich-typed organic field effect transistor and provided a process for manufacturing a new type of semiconductor by using two or more organic semiconductor materials. With this method, the overall properties of the organic field effect transistor can be improved effectively, especially, the FET's threshold voltage can be decreased effectively. The present invention provides a process for manufacturing a new heterojunction semiconductor with two or more kinds of organic semiconductor materials. With this method, the device designed in the same structure as presented in Patent No. 02129458.5 can work in the depletion mode with low power waste, meanwhile, it can work in the mode of super inverse.

SUMMARY OF THE INVENTION

The objective of this invention is to provide a HJOSFET with an insulation layer of gate.

Another objective of the invention is to provide a process for manufacturing FET.

To achieve the objectives as mentioned above, according to one aspect of the invention, the present application provide a FET comprising: a substrate (1), a gate electrode (2) formed on the substrate (1), a gate insulation layer (3) formed on the substrate (1) and the gate electrode (2), a first semiconductor layer (4) formed on the gate insulation layer (3), a source/drain electrode (5) formed on the first semiconductor layer (4), and a second semiconductor layer (6) formed on the first semiconductor layer (4) and the source/drain electrode (5).

According to another aspect of the present invention, it provides a process for manufacturing the FET, comprising the following steps:

Step a. forming a gate electrode made of a conducting material on the substrate;

Step b. forming an insulation layer on the substrate and the gate electrode;

Step c. forming the first semiconductor layer on the insulation layer formed in Step b;

Step d. forming a source electrode and a drain electrode on the first semiconductor layer;

Step e. forming the second semiconductor layer on the source electrode, the drain electrode and the first semiconductor layer.

According to the present invention, the active semiconductor layer is made up of two or more kinds of materials. The present invention is characterized by that the active semiconductor layer contains a heterojunction. The built-in electric field of the heterojunction can keep the active layer's channel of FET, which is made of organic semiconductor with high resistance, in on-state. Thus, the FET working in depletion mode is obtained.

According to one preferred embodiment, the semiconductor layer (4) and (6) are, respectively, comprised of one selected from the group consisting of CuPc, NiPc, ZnPc, CoPc, PtPc, $H_2Pc$, TiOPc, VOPc, thiophen oligomer, polythiophene, naphthacene, pentacene, perylene, perylene-3,4,9,10-tetracarboxylic-3,4,9,10-dianhydride (hereinafter to be abbreviated as PTCDA), fullerene, $F_{16}CuPc$, $F_{16}ZnPc$, $F_{16}FePc$ and $F_{16}CoPc$.

According to another preferred embodiment, the semiconductor layer (4) and (6) are, respectively, comprised of two or more selected from the group consisting of CuPc, NiPc, ZnPc, CoPc, PtPc, $H_2Pc$, TiOPc, VOPc, thiophen oligomer, polythiophene, naphthacene, pentacene, perylene, PTCDA, fullerene, $F_{16}CuPc$, $F_{16}ZnPc$, $F_{16}FePc$ and $F_{16}CoPc$.

Herein, "Pc" represents "phthalocyanine" and "Nc" represents "Naphthocyanine".

DETAILED DESCRIPTION OF THE PREFERRED EMBODIMENTS

The present invention will be described with reference to the accompanying drawings.

Figure 1:
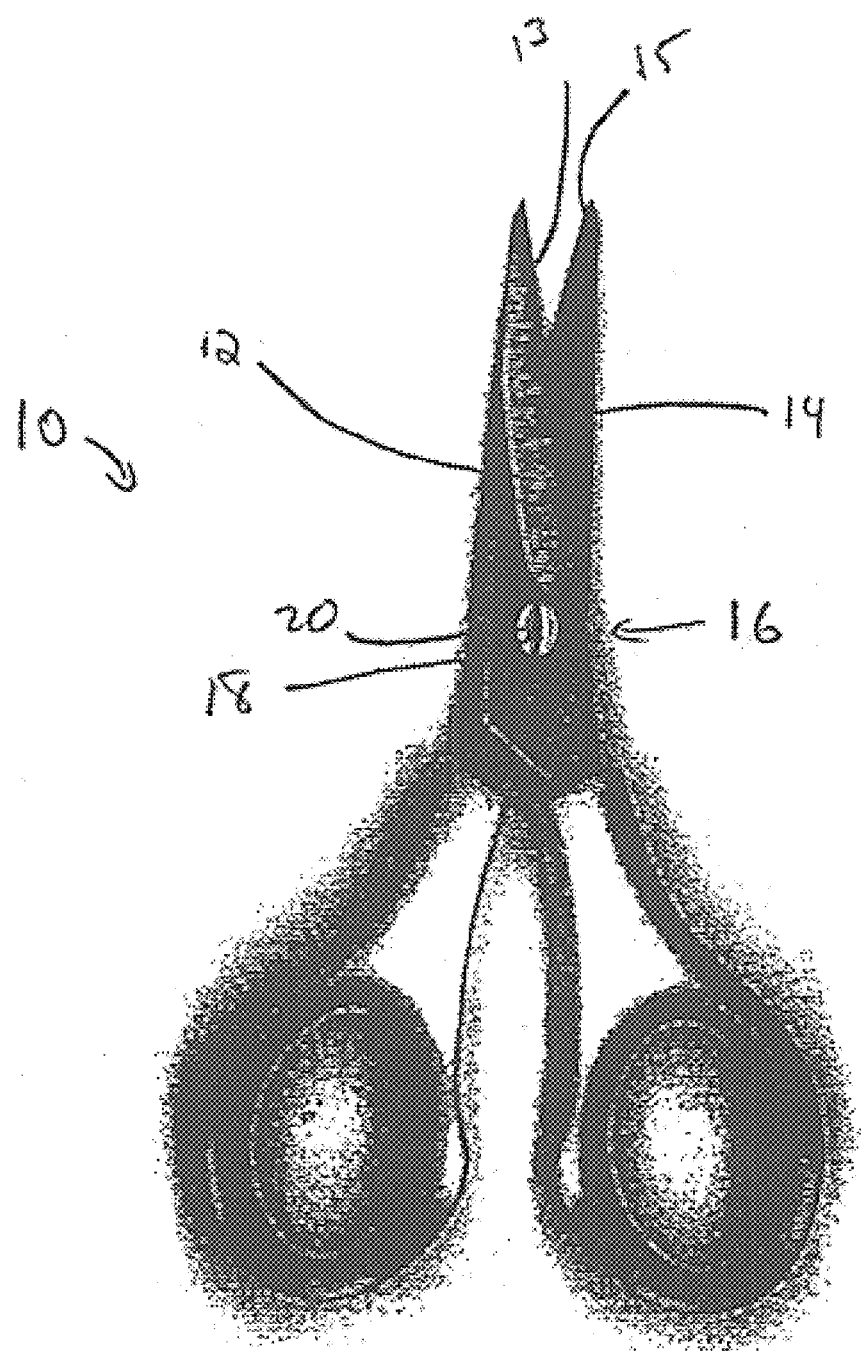
FIG. 1 shows the structure of an example of the present invention's FET.

FIG. 1 illustrates the structure of the present depletion-typed FET. The conducting material layer is set on the substrate (1) to form the gate electrode (2), the insulation material is set on the substrate and the gate electrode to form the gate insulation layer (3), the semiconductor material is set on the gate insulation layer to form the first semiconductor layer (4), the conducting material is set on the first semiconductor layer to form the source/drain electrode (5), and the semiconductor material is set on the first semiconductor layer (6) and the source/drain electrode (5) to form the second semiconductor layer together with the first semiconductor layer.

According to the first embodiment of the present invention, the first semiconductor layer adopts the existing P-typed semiconductor CuPc, and the second semiconductor layer adopts the existing N-typed semiconductor $F_{16}CuPc$. In the device, the first semiconductor layer contacted with the second semiconductor layer to form a heterojunction. The built-in electric field of the heterojunction obviously improves the horizontal conductivity of the active semiconductor layer, and the current between the source and drain electrode reaches microampere level under zero gate voltage. If a positive gate voltage is employed, the built-in electric field of the heterojunction will be decreased, and the current between the source and drain electrodes will be decreased. If additional positive gate voltage if further employed, the channel will be broke, the current between the source and the drain electrodes will be cut off and the FET will work at a typical hole-depletion working mode. On the contrary, if a negative gate voltage is employed, the built-in electric field of the heterojunction will be increased, and the current between the source and drain electrodes will be increased. If additional negative gate voltage is further employed, the current between the source and the drain electrodes will be in the saturated-state and in the on-state, and thus the FET will work in a typical hole-enhancement working mode. In this case, the FET holds the performance of strong output current.

According to the second embodiment of the present invention, the first active semiconductor layer is compounded with the existing P-typed semiconductor $H_2Pc$, CuPc, ZnPc, CoPc, NiPc and CuPc, and the second active semiconductor layer adopts the existing N-typed $F_{16}CuPc$. This device works in the mode of hole-depletion According to the third embodiment of the present invention, the first active semiconductor layer is compounded with the existing P-typed semiconductor CuPc layer and the eutectic layer of CuPc and ZnPc, and the second active semiconductor layer adopts the existing N-typed semiconductor $F_{16}CuPc$. This device works in the mode of hole-depletion.

According to the fourth embodiment of the present invention, the first active semiconductor layer adopts the existing N-typed semiconductor $F_{16}CuPc$, and the second semiconductor layer adopts the existing P-typed semiconductor CuPc. In this device, the first semiconductor layer is contact with the second semiconductor layer to form a heterojunction. The built-in electric field of the heterojunction obviously improves the horizontal conductivity of the active semiconductor layer, as a result, the current between the source and drain electrodes reaches microampere level under zero gate voltage. If a negative gate voltage is applied, the built-in electric field of the heterojunction will be decreased, the current between the source and drain electrodes will fall. If additional negative gate voltage is further applied, the channel will be broken, the current between the source and the drain electrodes will be in the off-state, and the FET will work in a typical electron-depletion working mode. If the applied negative gate voltage reaches –80 V, the current between the source and drain electrodes will be increased suddenly, now the FET will work in the hole-super-inverse working mode. On the contrary, if the gate is coupled in positive voltage, the built-in electric field of the heterojunction will be enhanced, and the current between the source and drain electrodes will increase. If further applying positive gate voltage, the current between the source and the drain electrodes will be in the staturated-state and on-state, now the FET will work in the typical electron-enhancement working mode. In this case, the FET holds the performance of strong output current.

Now the present invention will be further illustrated with reference to the following examples.

EXAMPLE 1

Copper phthalocyanine (CuPc), zin phthalocyanine (ZnPc), nickel phthalocyanine (NiPc), cobalt phthalocyanine (CoPc), $H_2Pc$, TiOPc, VOPc and $F_{16}CuPc$ used in this example are commercial products, and they have been sublimated and purified before being used.

On the 7059 glass substrate or the flexible plastic substrate 1, a film layer of metal Ta with about 200 nm in thickness was plated by using the radio frequency (RF) magnetism controlled sputtering method and shaped into the gate electrode 2 by using the photolithography method. On the gate electrode, a film layer of $Ta_2O_5$ with a thickness of about 100 nm was reactively sputterred as the gate insulation layer 3 by using direct current (DC) magnetism controlled sputtering method. Then depositing one selected from the group consisting of CuPc, ZnPc, NiPc, CoPc, $H_2Pc$, TiOPc and VOPc using the molecule vapor phase deposition method to prepare the first semiconductor layer 4 having a thickness of about 30 nm. Subsequently, using Au to prepare the source electrode and the drain electrode 5 with a thickness of about 30 nm. Finally, depositing $F_{16}CuPc$ using the molecule vapor phase deposition method to form the second active layer 6 having a thickness of 60 nm.

Figure 2:
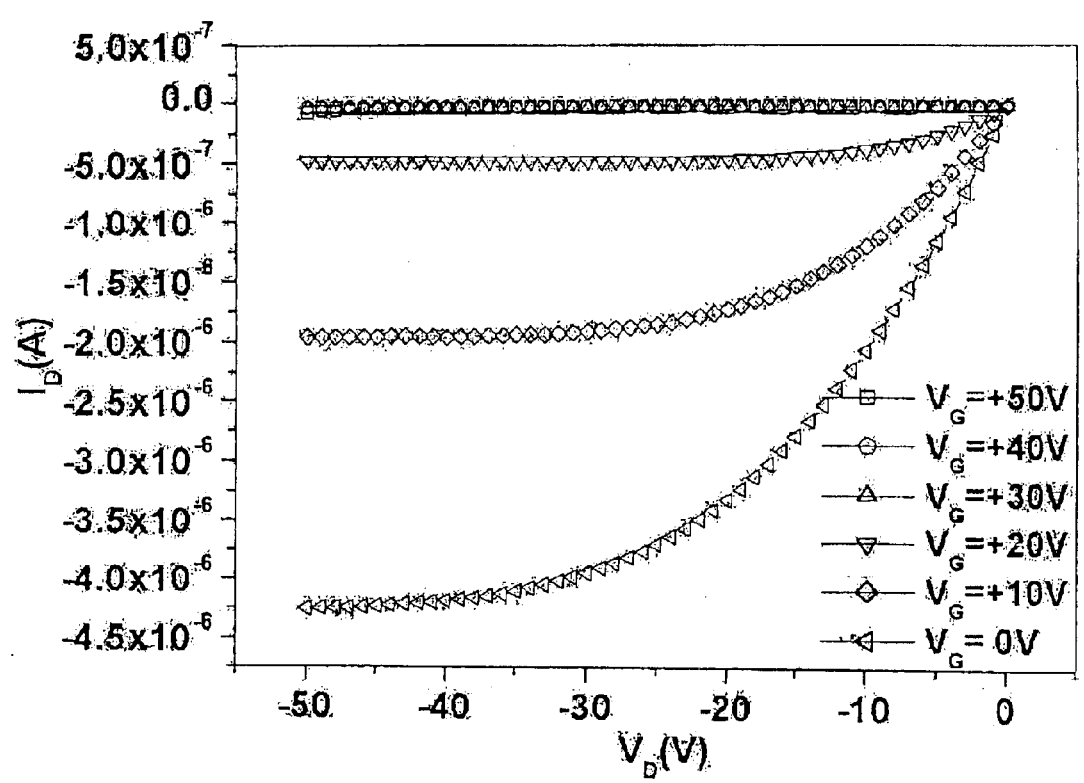
FIG. 2 shows the output characteristic curve of the present FET (illustrated in Example 1) working in the hole-depletion mode.
Figure 3:
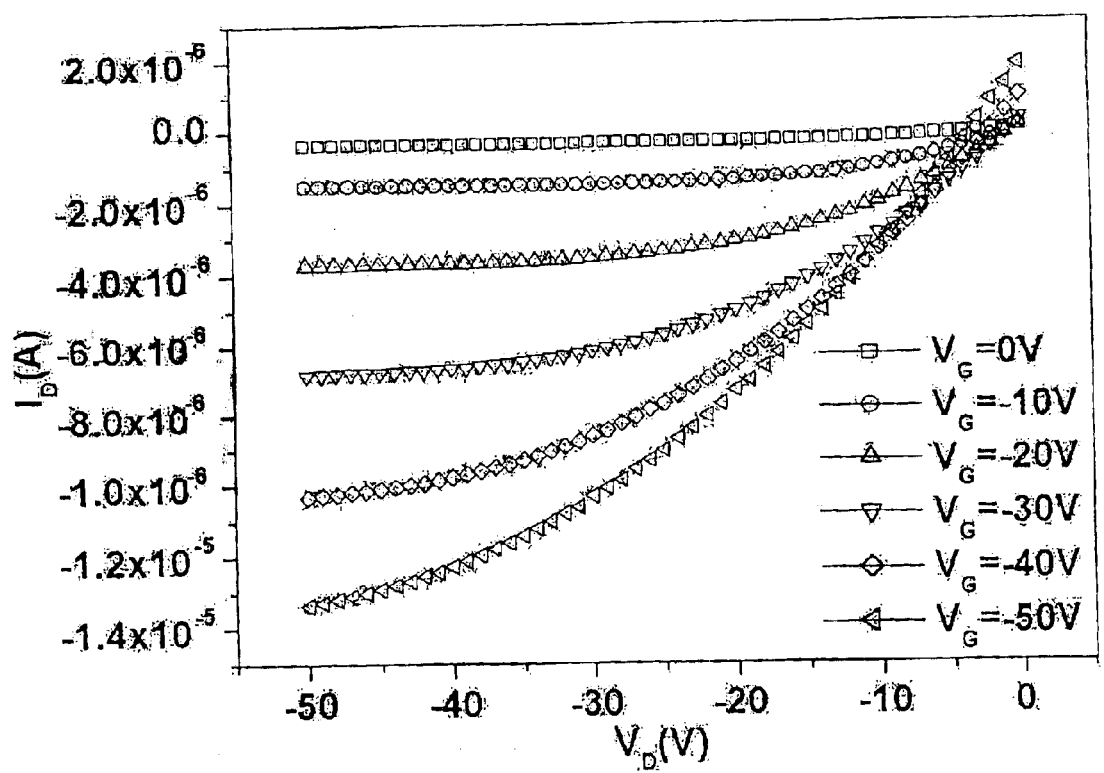
FIG. 3 shows the output characteristic curve of the present FET (illustrated in Example 1) working in the hole-accumulation mode.
Figure 4:
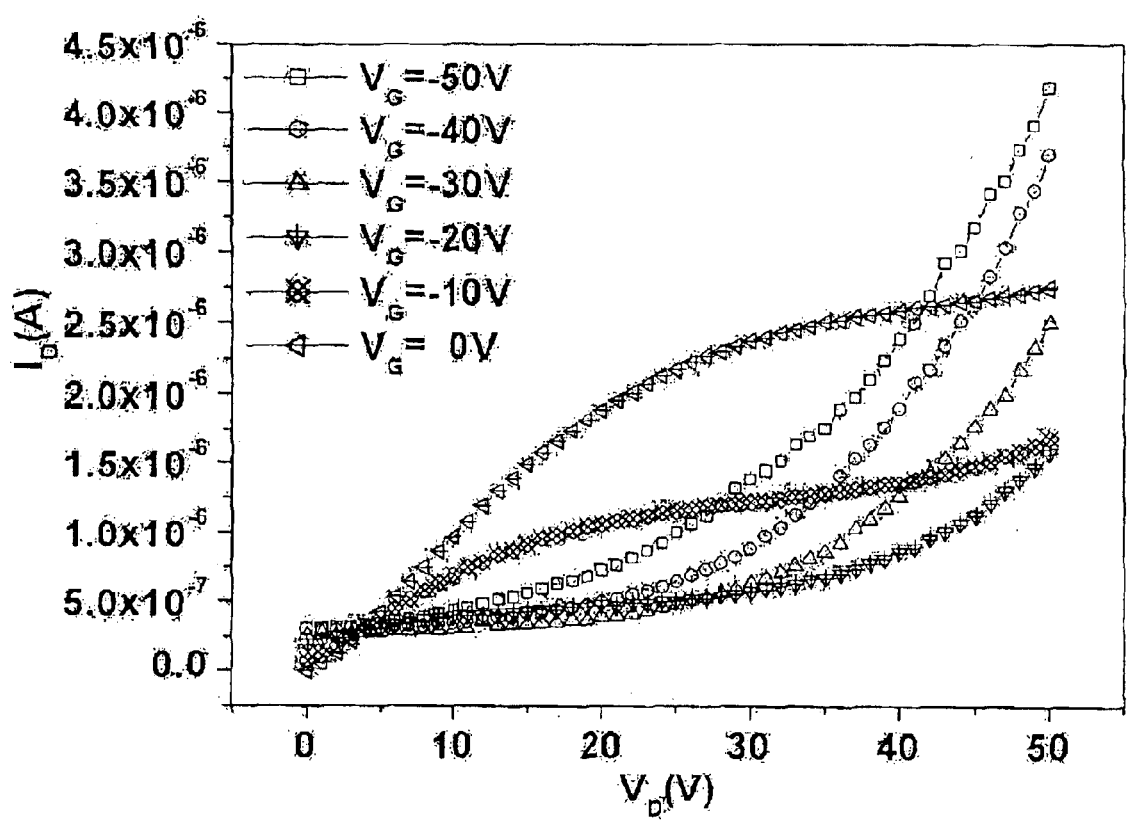
FIG. 4 shows the output characteristic curve of the present FET (illustrated in Example 4) working in the electron-depletion mode.
Figure 5:
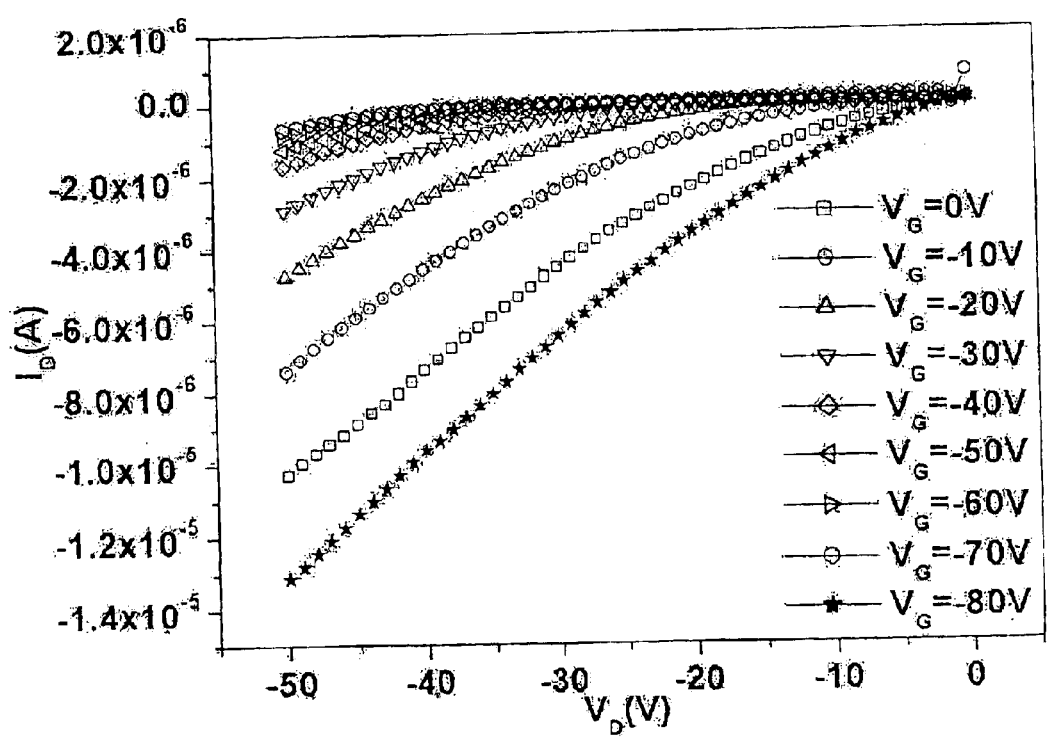
FIG. 5 shows the output characteristic curve of the present FET (illustrated in Example 4) working in the electron-accumulation mode.

FIG. 2 shows the output characteristic curve of the $CuPc/F_{16}CuPc$ FET working in the hole-depletion mode. In FIG. 2, the hole carrier mobility is 0.022 $cm^2/V.s$ in the saturation region, the threshold voltage is 24V, and the switching current ratio is $2 \times 10^2$. FIG. 3 shows the output characteristic curve of the $CuPc/F_{16}CuPc$ FET working in the hole-accumulation mode.

Table 1 lists the performances of the organic semiconductor FET working in the hole-depletion mode, wherein, the mobility and the threshold voltage are determined when $V_G$ equals to 0 V.

TABLE 1

| Semiconductor 4 | Semiconductor 6 | Hole mobility $cm^2/V \cdot s$ | Threshold Voltage V |
| --- | --- | --- | --- |
| CuPc | $F_{16}CuPc$ | 0.022 | 26 |
| NiPc | $F_{16}CuPc$ | 0.020 | 24 |
| ZnPc | $F_{16}CuPc$ | 0.024 | 20 |
| CoPc | $F_{16}CuPc$ | 0.009 | 18 |
| $H_2Pc$ | $F_{16}CuPc$ | 0.018 | 35 |
| TiOPc | $F_{16}CuPc$ | 0.009 | 31 |
| VOPc | $F_{16}CuPc$ | 0.007 | 30 |

EXAMPLE 2

Copper phthalocyanine (CuPc), zin phthalocyanine (ZnPc), nickel phthalocyanine (NiPc), cobalt phthalocyanine (CoPc), $H_2Pc$, TiOPc, VOPc and $F_{16}CuPc$ used in this example are commercial products, and they have been sublimated and purified before being used.

On the 7059 glass substrate or the flexible plastic substrate 1, a film layer of metal Ta with about 200 nm in thickness was plated by using the RF magnetism controlled sputtering method and shaped into the gate electrode 2 with the photolithography method. On the gate electrode, a film layer of $Ta_2O_5$ with a thickness of about 100 nm was reactively sputterred as the gate insulation layer 3 by using direct current (DC) magnetism controlled sputtering method. Then depositing two selected from the group consisting of CuPc, ZnPc, NiPc, CoPc, $H_2Pc$, TiOPc and VOPc using the molecule vapor phase deposition method to prepare the first semiconductor layer 4 having a thickness of about 30 nm. Subsequently, using Au to prepare the source electrode and the drain electrode 5 with a thickness of about 30 nm. Finally, depositing $F_{16}CuPc$ using the molecule vapor phase deposition method to form the second active layer 6 having a thickness of 60 nm.

The first semiconductor layer is compounded with CuPc and ZnPc, and the second semiconductor layer is formed with $F_{16}CuPc$. In this case, the FET device works in the hole-depletion working mode, and its hole-carrier mobility in the saturation region is 0.02 $cm^2$/V.s, its threshold voltage is 23V, and its current on/off ratio is $3 \times 10^2$.

Table 2 lists the performances of the organic semiconductor FET working in the hole-depletion mode, wherein, the mobility and the threshold voltage are determined when $V_G$ equals to 0 V.

TABLE 2

| Semiconductor 4 | Semiconductor 6 | Hole mobility $cm^2/V \cdot s$ | Threshold Voltage V |
|---|---|---|---|
| CuPc/NiPc | $F_{16}CuPc$ | 0.01 | 24 |
| CuPc/ZnPc | $F_{16}CuPc$ | 0.02 | 23 |
| CuPc/CoPc | $F_{16}CuPc$ | 0.006 | 20 |
| CuPc/$H_2$Pc | $F_{16}CuPc$ | 0.005 | 30 |

EXAMPLE 3

The products such as CuPc, ZnPC and $F_{16}CuPc$ used in the present experiment are commercial products and have been sublimated and purified before being used.

The FET device is prepared by the following method: plating a film layer of metal Ta with about 200 nm in thickness on the 7059 glass substrate or the flexible plastic substrate 1 using the RF magnetism controlled sputtering method and then shaping the film layer into the gate electrode 2 with the photolithography method; reactively sputtering on the gate electrode a film layer of $Ta_2O_5$ with a thickness of about 100 nm as the gate insulation layer 3 by using direct current (DC) magnetism controlled sputtering method; then, preparing the first semidconductor layer 4 by co-depositing CuPc and ZnPc with the total thickness of 5 nm following depositing a layer of CuPc with a thickness of 25 nm by using the molecule vapor phase deposition method; subsequently, preparing the source electrode and the drain electrode 5 of Au with a thickness of about 30 nm; finally, forming the second active layer 6 ($F_{16}CuPc$) having a thickness of 60 nm using the molecule vapor phase deposition method.

This FET device worked in the hole-depletion mode, and its hole-carrier mobility in the saturation region is 0.02 $cm^2$/V.s, its threshold voltage is 32V, and its current on/off ratio is $3 \times 10^2$.

EXAMPLE 4

The products such as CuPc, $F_{16}CuPc$, $F_{16}ZnPc$, $F_{16}FePc$ and $F_{16}CoPc$ used in this experiment are commercial products, and they have been sublimated and purified before being used.

The FET device is prepared by the following method: plating a film layer of metal Ta with about 200 nm in thickness on the 7059 glass substrate or the flexible plastic substrate 1 using the RF magnetism controlled sputtering method and then shaping the film layer into the gate electrode 2 with the photolithography method; reactively sputtering on the gate electrode a film layer of $Ta_2O_5$ with a thickness of about 100 nm as the gate insulation layer 3 by using direct current (DC) magnetism controlled sputtering method; then, preparing the first semidconductor layer 4 ($F_{16}CuPc$) with a thickness of 30 nm using the molecule vapor phase deposition method; subsequently, preparing the source electrode and the drain electrode 5 of Au with a thickness of about 30 nm; finally, forming the second active layer 6 (CuPc) having a thickness of 60 nm using the molecule vapor phase deposition method.

The $F_{16}CuPc$/CuPc FET works in the electron-depletion mode. In this case, the FET's hole-carrier mobility in the saturation region is 0.015 $cm^2$/V.s, its threshold voltage is −25V, and its current on/off ratio is 350. The $F_{16}CuPc$/CuPc FET also can work in the hole-accumulation mode. In this case, when the gate voltage reaches −80 V, super-inverse hole-layer will appear.

Table 3 lists the performances of the organic semiconductor FET working in the electron-depletion mode, wherein, the mobility and threshold voltage are determined when $V_G$ equals to 0 V.

TABLE 3

| Semiconductor 4 | Semiconductor 6 | Hole mobility $cm^2/V \cdot s$ | Threshold Voltage V |
|---|---|---|---|
| $F_{16}CuPc$ | CuPc | 0.015 | −25 |
| $F_{16}ZnPc$ | CuPc | 0.001 | −21 |
| $F_{16}FePc$ | CuPc | 0.004 | −16 |
| $F_{16}CoPc$ | CuPc | 0.009 | −18 |

The present invention has been described by way of the above examples. The present invention is not limited to the modes described in the respective examples but naturally includes various other modes according to the principle of the present invention. In general, the FET according to the present invention can be processed to the elements of the 2D and 3D integrated devices. These integrated devices can be applied in flexible IC, the active matrix display and the like. The FET according to the present invention can be processed at low temperature. Besides the traditional photolithography, many methods such as softlithography, printing and the like can be used to prepare the FET of the present invention.

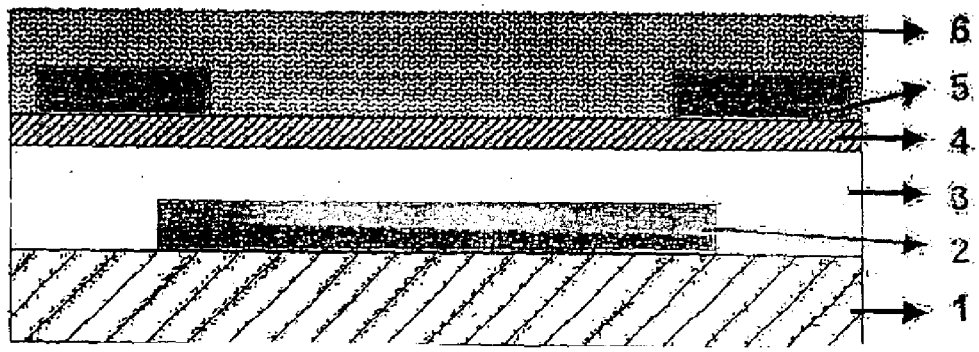

We claim:

1. A heterojunction organic semiconductor field effect transistor, comprising:
   a substrate (1),
   a gate electrode (2) formed on the substrate (1),
   a gate insulation layer (3) formed on the substrate (1) and the gate electrode (2),
   a first semiconductor layer (4) formed on the gate insulation layer (3),
   a source/drain electrode (5) formed on the first semiconductor layer (4), and
   a second semiconductor layer (6) formed on the first semiconductor layer (4) and the source/drain electrode (5).

2. The field effect transistor according to claim 1, wherein the semiconductor material is organic semiconductor material or organic/inorganic hybrid material.

3. The field effect transistor according to claim 1, wherein the first semiconductor layer (4) or the second semiconductor layer (6) is made of a single kind of semiconductor material.

4. The field effect transistor according to claim 3, wherein the first semiconductor layer (4) or the second semiconductor layer (6) is made of a mixture, eutectic or laminated compound of two or more kinds of molecules.

5. The field effect transistor according to claim 2, wherein the carrier mobility in the active layer of the organic semiconductor is over $10^{-3}$ cm$^2$/Vs.

6. The field effect transistor according, to claim 3, wherein the semiconductor layer (4) and (6) are, respectively, comprised of one selected from the group consisting of CuPc, NiPc, ZnPc, CoPc, PtPc, H$_2$PC, TiOPc, VOPc, thiophen oligomer, polythiophene, naphthacene, pentacene, perylene, PTCDA, fullerene, F$_{16}$CuPc, F$_{16}$ZnPc, F$_{16}$FePc and F$_{16}$CoPc.

7. The field effect transistor according to claim 4, wherein the semiconductor layer (4) and (6) are, respectively, comprised of two or more selected from the group consisting of CuPc, NiPc, ZnPc, CoPc, PtPc, H$_2$Pc, TiOPc, VOPc, thiophen oligomer, polythiophene, naphthacene, pentacene, perylene, PTCDA, fullerene, F$_{16}$CuPc, F$_{16}$ZnPc, F$_{16}$FePc and F$_{16}$CoPc.

8. A process for manufacturing a organic semiconductor field effect transistor containing a heterojunction, comprising the following steps:

Step a. forming a gate electrode on a substrate;

Step b. forming an insulation layer on the substrate and the gate electrode;

Step c. forming a first semiconductor layer on the insulation layer formed in Step b;

Step d. forming a source electrode and a drain electrode on the first semiconductor layer;

Step e. forming a second semiconductor layer on the source electrode, the drain electrode and the first semiconductor layer.

9. A process for manufacturing a organic semiconductor field effect transistor containing a heterojunction, comprising the following steps:

Step a. forming a first semiconductor layer on a substrate;

Step b. forming a source electrode and a drain electrode on the first semiconductor layer;

Step c. forming a second semiconductor layer on the first semiconductor layer, the source electrode and the drain electrode;

Step d. forming an insulation layer on the second semiconductor layer; and

Step e. forming a gate electrode on the insulation layer formed in Step d.

* * * * *

UNITED STATES PATENT AND TRADEMARK OFFICE
CERTIFICATE OF CORRECTION

PATENT NO.     : 6,806,492 B2
DATED          : October 19, 2004
INVENTOR(S)    : Donghang Yan et al.

It is certified that error appears in the above-identified patent and that said Letters Patent is hereby corrected as shown below:

The title page should be deleted and substitute therefor the attached title page as shown on the attached page.

Signed and Sealed this

Thirty-first Day of May, 2005

JON W. DUDAS
*Director of the United States Patent and Trademark Office*

United States Patent
Yan et al.

(10) Patent No.: US 6,806,492 B2
(45) Date of Patent: Oct. 19, 2004

(54) HETEROJUNCTION ORGANIC SEMICONDUCTOR FIELD EFFECT TRANSISTOR (FET) WITH A GATE INSULATION LAYER AND MANUFACTURING PROCESS THEREOF

(75) Inventors: Donghang Yan, Changchun (CN); Jian Zhang, Changchun (CN); Jun Wang, Changchun (CN); Haibo Wang, Changchun (CN); Xuanjun Yan, Changchun (CN)

(73) Assignee: Changchun Institute of Applied Chemistry Chinese Academy of Science, Changchun (CN)

(*) Notice: Subject to any disclaimer, the term of this patent is extended or adjusted under 35 U.S.C. 154(b) by 0 days.

(21) Appl. No.: 10/614,987

(22) Filed: Jul. 9, 2003

(65) Prior Publication Data
US 2004/0150050 A1 Aug. 5, 2004

(30) Foreign Application Priority Data
Jan. 30, 2003 (CN) .............................. 03102064 A

(51) Int. Cl.$^7$ .................. H01L 35/24; H01L 51/40
(52) U.S. Cl. .................. 257/40; 257/192; 257/347; 438/99; 438/151
(58) Field of Search .................. 257/40, 192, 77, 257/347, 613, 289, 66; 438/99, 151, 158, 161

(56) References Cited

U.S. PATENT DOCUMENTS

| | | | |
|---|---|---|---|
| 5,107,308 A | * | 4/1992 | Koezuka et al. ............ 257/40 |
| 5,355,235 A | * | 10/1994 | Nishizawa et al. .......... 349/43 |
| 5,500,537 A | * | 3/1996 | Tsumura et al. ............ 257/40 |
| 5,596,208 A | * | 1/1997 | Dodabalapur et al. ....... 257/66 |
| 6,621,098 B1 | * | 9/2003 | Jackson et al. ............ 257/40 |
| 6,635,508 B2 | * | 10/2003 | Arai et al. ................ 438/99 |
| 2002/0164835 A1 | * | 11/2002 | Dimitrakopoulos et al. .. 438/99 |

* cited by examiner

*Primary Examiner*—Mark V. Prenty
(74) *Attorney, Agent, or Firm*—Fei-Fei Chao; Venable LLP

(57) ABSTRACT

A organic semiconductor field effect transistor that can work in the depletion mode or super-inverse mode, comprising: a substrate (1), a gate electrode (2) formed on the substrate (1), a gate insulation layer (3) formed on the substrate (1) and the gate electrode (2), a first semiconductor layer (4) formed on the gate insulation layer (3), a source electrode and a drain electrode (5) formed on the first semiconductor layer (4), and a second semiconductor layer (6) formed on the first semiconductor layer (4) and the source/drain electrodes (5).

9 Claims, 5 Drawing Sheets